(12) United States Patent
Maggiolino

(10) Patent No.: US 6,262,618 B1
(45) Date of Patent: Jul. 17, 2001

(54) SHOOT-THROUGH PREVENTION CIRCUIT FOR MOTOR CONTROLLER INTEGRATED CIRCUIT GATE DRIVER

(75) Inventor: Joseph Maggiolino, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/465,451

(22) Filed: Dec. 17, 1999

Related U.S. Application Data

(60) Provisional application No. 60/115,607, filed on Jan. 12, 1999.

(51) Int. Cl.$^7$ .................................................. H03H 11/26
(52) U.S. Cl. ............................ 327/285; 327/271; 327/278
(58) Field of Search ..................................... 327/261, 264, 327/270, 271, 272, 278, 285, 393

(56) References Cited

U.S. PATENT DOCUMENTS

| | | | |
|---|---|---|---|
| 3,753,012 | * 8/1973 | Frederiksen et al. | ................... 327/74 |
| 4,843,265 | * 6/1989 | Jiang | ................................... 327/262 |
| 5,311,071 | * 5/1994 | Ueda | ..................................... 327/63 |
| 5,936,451 | * 8/1999 | Phillips | ................................. 327/285 |
| 6,091,286 | * 7/2000 | Blauschild | ............................ 327/543 |

* cited by examiner

Primary Examiner—Toan Tran
Assistant Examiner—Cassandra Cox
(74) Attorney, Agent, or Firm—Ostrolenk, Faber, Gerb & Soffen, LLP

(57) ABSTRACT

A time delay circuit for generating a dead time for a high-side/low-side transistor pair. A four transistor comparator circuit is employed with an input voltage reference transistor and output current reference transistor, and with a single capacitor determining the total time delay between the turn on of one of the output power devices and the turn off of the other. The time delay is closely related to the capacitance value (within 10%); power dissipation is minimized; the circuit is reduced to six transistors, and the time delay (or "dead time") can be accurately and easily programmed by the user.

8 Claims, 3 Drawing Sheets

SHOOT-THROUGH PREVENTION CIRCUIT FOR MOTOR CONTROLLER INTEGRATED CIRCUIT GATE DRIVER

This application claims the benefit of U.S. Provisional Application No. 60/115,607, filed Jan. 12, 1999.

BACKGROUND OF THE INVENTION

1. Field of the Invention

This invention relates to an integrated circuit gate driver for driving MOSgated power devices used in motor controller and other applications and, more specifically, to a novel driver IC for a motor controllers application which prevents the simultaneous turn on of high side and low side MOSgated devices.

2. Description of the Related Art

Gate driver integrated circuits for control of MOSgated power devices, such as from MOSFETs, IGBTs, gate controlled thyristors and the like are well known. It is also known that in circuits using high-side and low side MOSgated devices, such as motor controllers, that the two MOSgated devices cannot be on at the same time, which would create a direct short circuit or "shoot-through" condition.

Many circuits are known to prevent this shoot-through condition. However, these circuits are complex; are not easily adjusted by a customer or for a particular application; have a relatively large power dissipation and are not accurate.

It would be desirable to produce a shoot-through prevention circuit which is simple, has smaller power dissipation and can be accurately and easily programmed by a user.

SUMMARY OF THE INVENTION

In accordance with the time delay circuit of the present invention, a four transistor comparator circuit is employed with an input voltage reference transistor and output current reference transistor, and with a single capacitor determining the total time delay between the turn on of one of the output power devices and the turn off of the other. The time delay is closely related to the capacitance value (within 10%); power dissipation is minimized; the circuit is reduced to six transistors, and the time delay (or "dead time") can be accurately and easily programmed by the user.

More specifically the time delay circuit of the present invention includes an input terminal connected to the gate of a control transistor for controlling the state of the transistor, a timing capacitor connected in parallel across the control transistor, a current reference connected to the timing capacitor for charging the capacitor in accordance with the state of the control transistor, a voltage reference, and a comparator connected to the timing capacitor and to the voltage reference for comparing the voltage on the timing capacitor with the voltage of the voltage reference and outputting a signal to an output terminal in accordance therewith.

The circuit of the present invention is preferably formed in an integrated circuit, with the timing capacitor being internal to the integrated circuit. The voltage reference is generated by flowing current from the current reference through a resistor, the resistor preferably being disposed externally to the integrated circuit. The time delay can advantageously be programmed by adjusting the value of the external resistor.

Other features and advantages of the present invention will become appraarent when the following description of the invention is read in conjuction with the accompanying drawings.

BRIEF DESCRIPTION OF THE DRAWINGS

FIGS. 2A and 2B show the input and output voltages of the chip driver of FIG. 1 with a conventional dead time arrangement in FIG. 2B to prevent shoot through.

DETAILED DESCRIPTION OF THE PREFERRED EMBODIMENT

Figure 1:
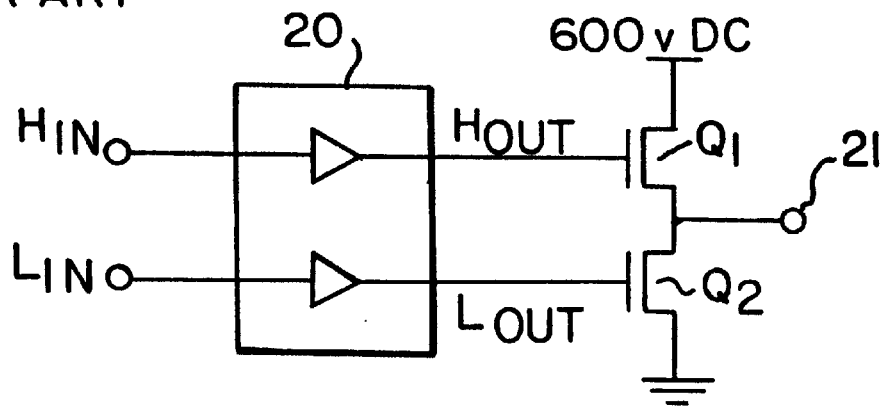
FIG. 1 is a block diagram of a MOSFET gate driver chip and the two power MOSgated devices controlled thereby.

FIG. 1 shows a typical gate driver IC 20 which contains internal integrated circuits in a single chip for driving MOSgated power devices $Q_1$ and $Q_2$. MOSFETs $Q_1$ and $Q_2$ are alternately turned on and off in response to input signals at input terminals $H_{IN}$ and $L_{IN}$ respectively. MOSgated device $Q_1$ is a "high side" device connected to the input voltage (shown as 600 volts d–c) for the output circuit connected between node 21 and ground. Device $Q_2$ is a low side device connected between node 21 and ground. The output circuit (not shown) connected to node 21 may typically be a motor load which is varied in speed by appropriate pulse width modulation control.

Figure 2A:
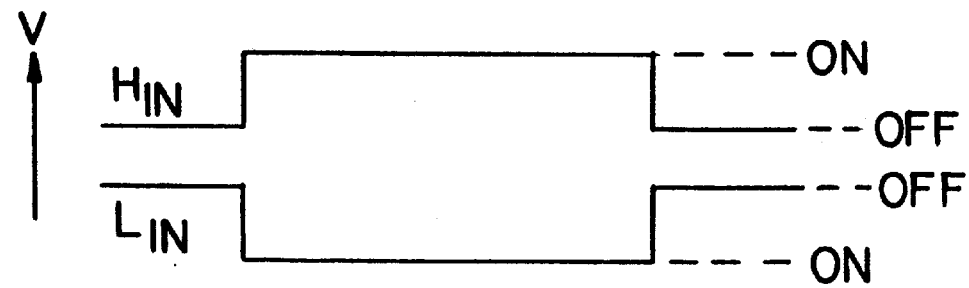

FIG. 2A shows the waveform of typical input signals $H_{IN}$ and $L_{IN}$. It will be seen that if both $Q_1$ and $Q_2$ of FIG. 1 are on simultaneously, there will be a short circuit from high voltage to ground, which can destroy the device. Therefore, as shown in FIG. 2B, the internal circuitry of chip 20 insures delays or "dead times" A and B between the beginning and ending respectively of the output $H_{OUT}$ and $L_{OUT}$.

Figure 2B:
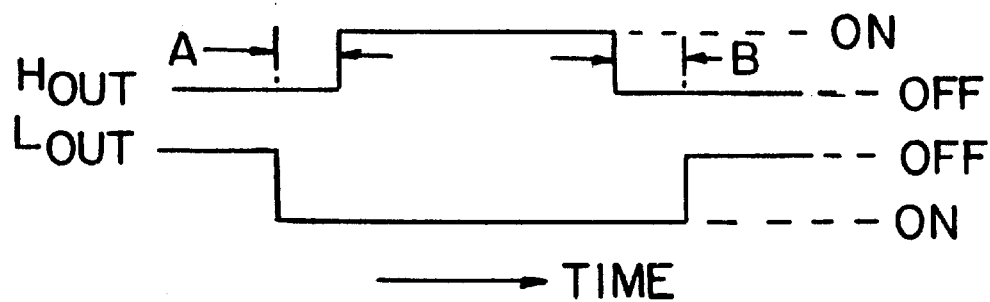
Figure 3:
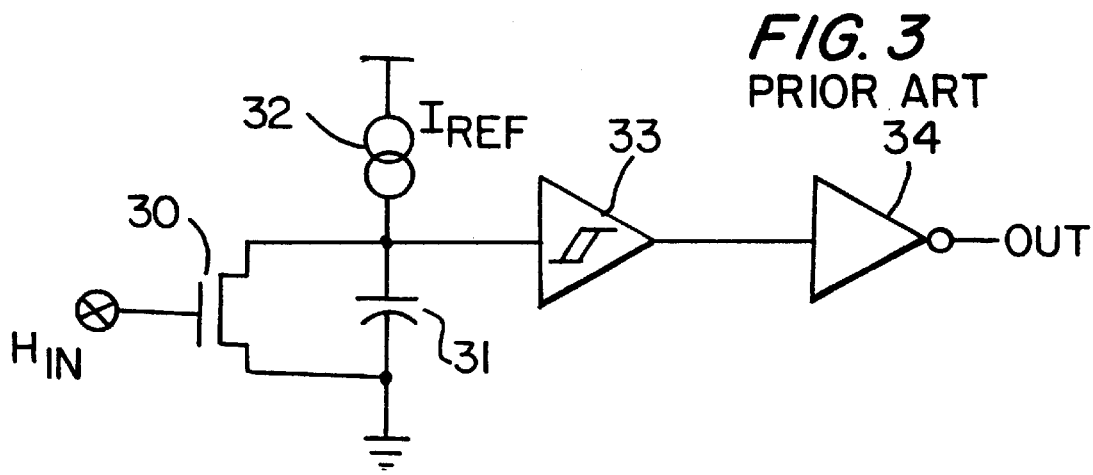
FIG. 3 schematically illustrates one circuit which can be used to generate the wave shapes of FIGS. 2A and 2B.

FIG. 3 shows a typical prior art internal time delay circuit which can be contained within chip 20 of FIG. 1 to create the dead time delays A and B of FIG. 2B. Thus, in FIG. 3 the input terminal $H_{IN}$ is connected to a control MOSFET 30 connected across timing capacitor 31. A current source 32 forces a charging current $I_{REF}$ into capacitor 31 when MOSFET 30 is off. The output at node 32 is connected to a suitable circuit, such as a Schmitt trigger 33 and inverter 34. The delay in the switching of trigger 33, controlled in turn by the charge level of capacitor 31 will produce the delays A and B.

The circuit of FIG. 3 is complex and produces a relatively high power dissipation. Further, the circuit is relatively inaccurate, in part because parasitic capacitances in the circuit change the nominal delay produced by the capacitor 31.

Figure 4:
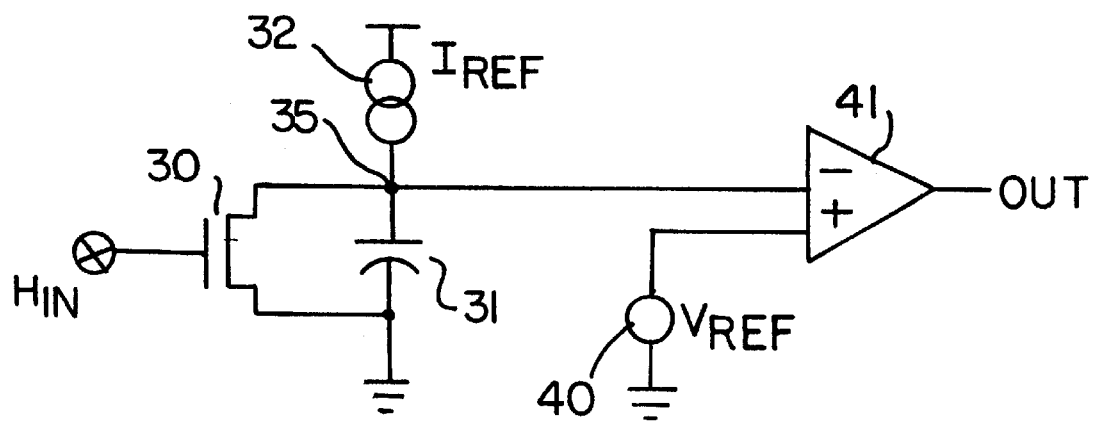
FIG. 4 is a schematic diagram of the circuit of the present invention.

FIG. 4 is a schematic diagram of the circuit of the invention. As compared to FIG. 3, it will be noted that a voltage reference 40 is added and is input, with the signal at node 35, to comparator 41. It will be later shown that comparator 41 can be easily implemented with four transistors. The use of current reference source 32, capacitor 31 and voltage reference 40 permit very simple implementation of the circuit and a high accuracy relationship (under about 20%) between time delay RC shown in FIG. 5 and the value of the internal capacitor. Furthermore, the circuit is externally programmable (over a ten to one range) and is relatively immune to dead time delay variation due to variations in temperatures, supply voltage and process variations.

Figure 6:
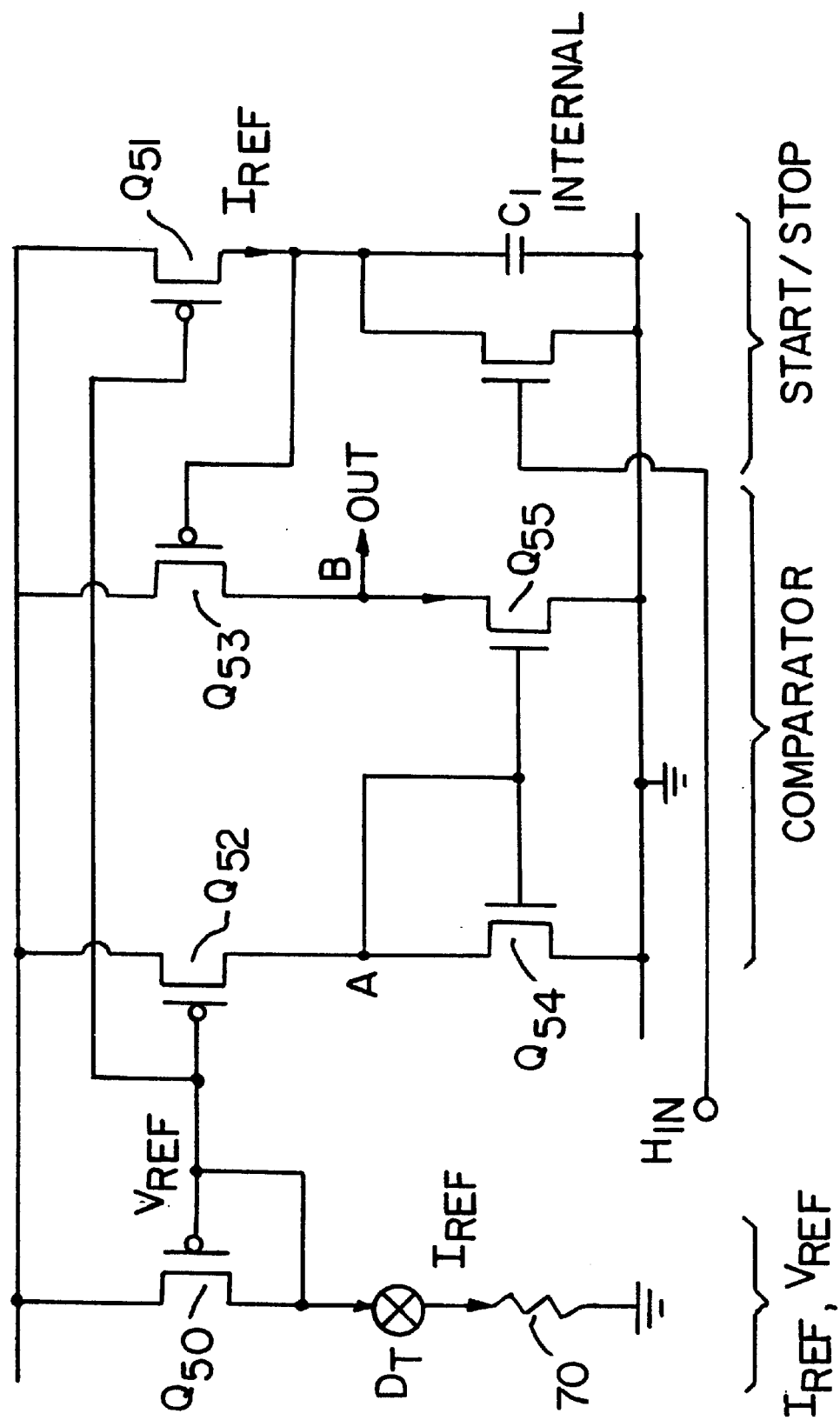
FIG. 6 is a more detailed circuit diagram of the six-transistor control circuit of the present invention.

FIG. 6 shows a preferred implementation for the circuit of FIG. 4 and shows the relative simplicity of the circuit. The input $I_{REF}$ is controlled by MOSFETs $Q_{50}$ and $Q_{51}$. The voltage $V_{REF}$ is produced by the external resistor 70. The comparator 41 is formed by four transistors $Q_{52}$, $Q_{53}$, $Q_{54}$ and $Q_{55}$.

Figure 5:
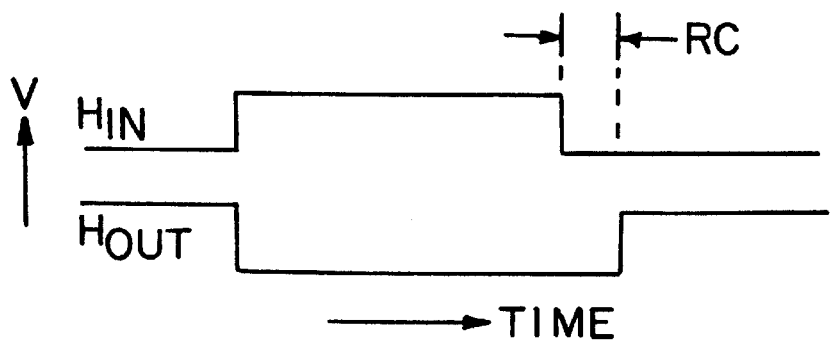
FIG. 5 shows the output control voltages produced by the circuit of FIG. 4.

Preferably, transistors $Q_{50}$ and $Q_{51}$ are matched to one another; transistors $Q_{52}$ and $Q_{53}$ are matched to one another and transistors $Q_{54}$ and $Q_{55}$ are matched to one another. This maximizes the accuracy of the circuit. Further, the circuit configuration at "A" and "B" in FIG. 6 minimizes parasitic capacitance. It will be noted that the time delay RC in FIG. 5 is fixed by the value of internal capacitor $C_1$ and resistor 70 (which may be external of the chip). Thus, $$t_{delay} = \frac{C_1 V_{REF}}{I_{REF}} = C_1 R_{70}$$

Thus, the novel circuit of the invention permits a user to control dead time externally of the chip, enabling the user to simplify any PWM (pulse width modulated) circuit to be used.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A time delay circuit, comprising:
    an input terminal connected to the gate of a control transistor for controlling the state of said transistor;
    a timing capacitor connected in parallel across said control transistor;
    a current reference connected to said timing capacitor for charging said capacitor in accordance with the state of said control transistor;
    a voltage reference comprising voltage generated by flowing current from said current reference through a resistor; and
    a comparator connected to said timing capacitor and to said voltage reference for comparing the voltage on said timing capacitor with the voltage of said voltage reference and outputting a signal to an output terminal in accordance therewith.

2. The time delay circuit of claim 1, wherein said circuit is formed in an integrated circuit and said timing capacitor is internal to said integrated circuit.

3. The time delay circuit of claim 1, wherein said resistor is disposed externally to said integrated circuit.

4. The time delay circuit of claim 1, wherein said current reference comprises first and second transistors.

5. The time delay circuit of claim 4, wherein said first and second transistors are matched to one another.

6. The time delay circuit of claim 4, wherein said comparator comprises third and fourth transistors, and fifth and sixth transistors.

7. The time delay circuit of claim 6, wherein said third and fourth transistors are matched to one another, and said fifth and sixth transistors are matched to one another.

8. The time delay circuit of claim 3, wherein the time delay comprises the signal at the output terminal which is determined by the value of said timing capacitor and can be programmed by adjusting the value of said resistor.

* * * * *